(12) United States Patent
Isono

(10) Patent No.: US 7,982,843 B2
(45) Date of Patent: Jul. 19, 2011

(54) IMAGE DISPLAY APPARATUS HAVING FLEXIBLE PRINTED CIRCUIT BOARD

(75) Inventor: Aoji Isono, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 149 days.

(21) Appl. No.: 12/357,843

(22) Filed: Jan. 22, 2009

(65) Prior Publication Data

US 2009/0195996 A1   Aug. 6, 2009

(30) Foreign Application Priority Data

Feb. 6, 2008  (JP) ................................. 2008-026341

(51) Int. Cl.
*G02F 1/1345*   (2006.01)

(52) U.S. Cl. .............................. 349/150; 349/58; 349/59

(58) Field of Classification Search .................... 349/59, 349/150
See application file for complete search history.

(56) References Cited

U.S. PATENT DOCUMENTS

| | | | |
|---|---|---|---|
| 5,710,607 A * | 1/1998 | Iwamoto et al. ................ | 349/60 |
| 6,160,349 A * | 12/2000 | Nagai .............................. | 315/85 |
| 6,891,582 B2 * | 5/2005 | Hwang ............................ | 349/58 |
| 2005/0286002 A1 | 12/2005 | Tajima ........................... | 349/139 |
| 2006/0001821 A1 * | 1/2006 | Dewa et al. .................... | 349/150 |

FOREIGN PATENT DOCUMENTS

JP   2006-047979   2/2006

* cited by examiner

*Primary Examiner* — Richard H Kim
(74) *Attorney, Agent, or Firm* — Fitzpatrick, Cella, Harper & Scinto

(57) ABSTRACT

An image display apparatus includes a display panel having a plurality of wirings and a plurality of display devices connected to the plurality of wirings, a control circuit substrate which outputs a control signal and is arranged on a backside of the display panel, and a flexible printed circuit board which has a flexible substrate and wirings formed on the flexible substrate and electrically connects the display panel and the control circuit substrate. The flexible printed circuit board has an angular shape. In addition, a conductive cover covers the flexible printed circuit board from a portion connected to the control circuit substrate to a portion connected to the display panel with an angular shape according to the shape of the flexible printed circuit board, and is connected to the control circuit substrate.

12 Claims, 10 Drawing Sheets

MODULATION SIGNAL

SCANNING SIGNAL

RETURN CURRENT FOR LOOP CURRENT ON IC PACKAGE(DRIVING SIGNAL CURRENT)

LOOP CURRENT

RETURN CURRENT FOR LOOP CURRENT ON IC PACKAGE (CONTROL SIGNAL CURRENT / POWER SOURCE CURRENT)

LOOP CURRENT

LOOP CURRENT
(DRIVING SIGNAL CURRENT)

RETURN CURRENT
FOR LOOP CURRENT
(DRIVING SIGNAL CURRENT)

though speech image US 7,982,843 B2

IMAGE DISPLAY APPARATUS HAVING FLEXIBLE PRINTED CIRCUIT BOARD

BACKGROUND OF THE INVENTION

1. Field of the Invention

The present application relates to an image display apparatus.

2. Description of the Related Art

Conventionally, one example of information devices is an image display apparatus. Examples of image display apparatuses are television devices and monitors of computers.

In such image display apparatuses, intensity of electromagnetic waves (electromagnetic radiation noises) which leak outside the apparatuses should be not more than a regulation value. For this reason, a technique which reduces the leakage of the electromagnetic waves is desired. A constitution which reduces the leakage of the electromagnetic waves is desired to be obtained easily.

The constitution which reduces the electromagnetic waves leaking from front surfaces of the image display apparatuses is disclosed in Japanese Patent Application Laid-Open No. 2006-47979. In the image display apparatus disclosed in Japanese Patent Application Laid-Open No. 2006-47979, a driving circuit is arranged in an approximately sealed space so that leaking electromagnetic waves are reduced.

SUMMARY OF THE INVENTION

It is an object of the present invention to provide a technique which reduces electromagnetic waves leaking from an image display apparatus in a simple constitution. Particularly the object is to provide a technique which reduces electromagnetic waves generated due to an electric current flowing in a flexible printed circuit board.

In order to achieve the above object, an image display apparatus of the present invention is characterized by including: a display panel having a plurality of wirings and a plurality of display devices connected to the plurality of wirings; a control circuit substrate which outputs a control signal; a flexible printed circuit board which has a flexible substrate and wirings formed on the flexible substrate, and electrically connects the display panel and the control circuit substrate; and a conductive cover which covers the flexible printed circuit board from a portion connected to the control circuit substrate to a portion connected to the display panel and is connected to the control circuit substrate.

According to the present invention, a technique which reduces electromagnetic waves leaking from the image display apparatus in a simple constitution can be provided. Particularly, a technique which reduces electromagnetic waves generated by electric currents flowing on the flexible printed circuit board can be provided.

Further features of the present invention will become apparent from the following description of exemplary embodiments with reference to the attached drawings.

DESCRIPTION OF THE EMBODIMENTS

An embodiment of the present invention is described below. The present invention can be applied to, for example, plasma display apparatuses and electron beam display apparatuses. Particularly, the electron beam display apparatus has a preferable mode to which the present invention is applied because a high-speed driving signal can be input into a panel.

Figure 1A:
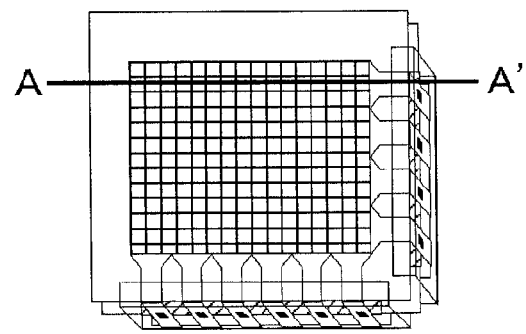
FIG. 1A is a perspective view illustrating an image display apparatus according to an embodiment.
Figure 1B:
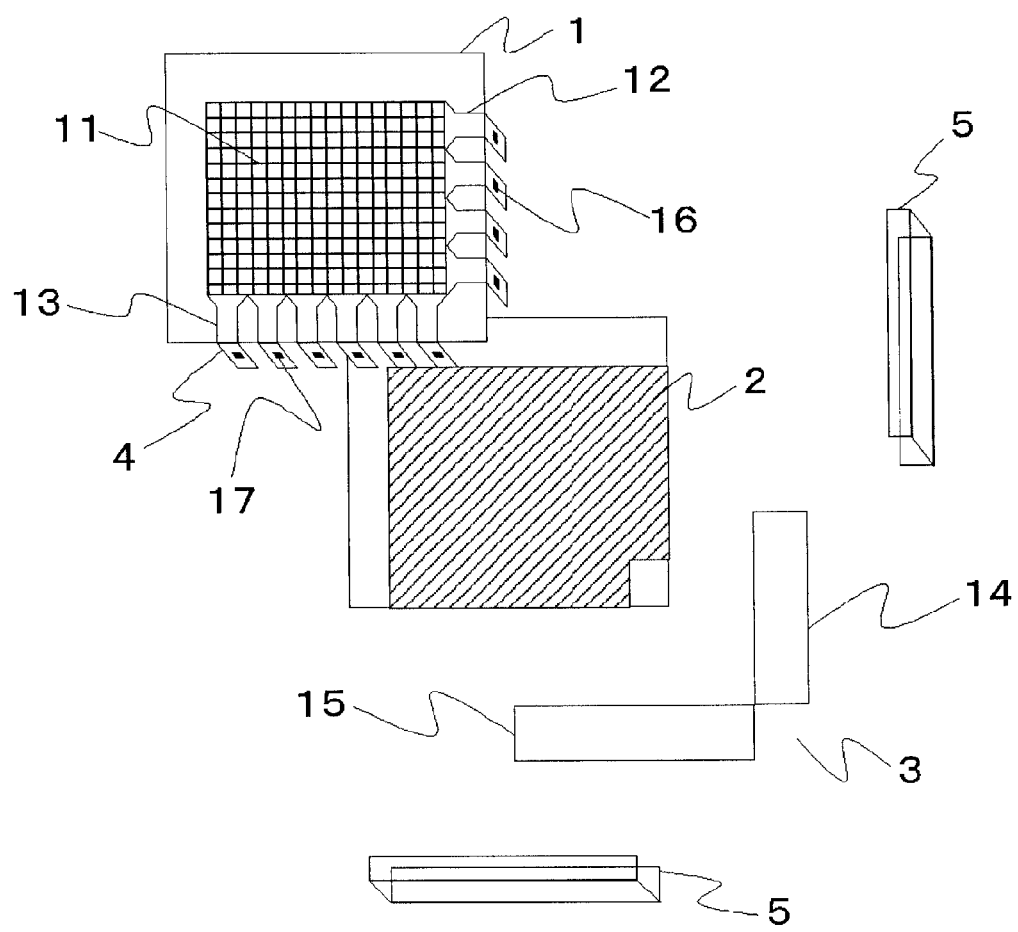
FIG. 1B is a layer structural diagram illustrating the image display apparatus according to the embodiment.
Figure 2:
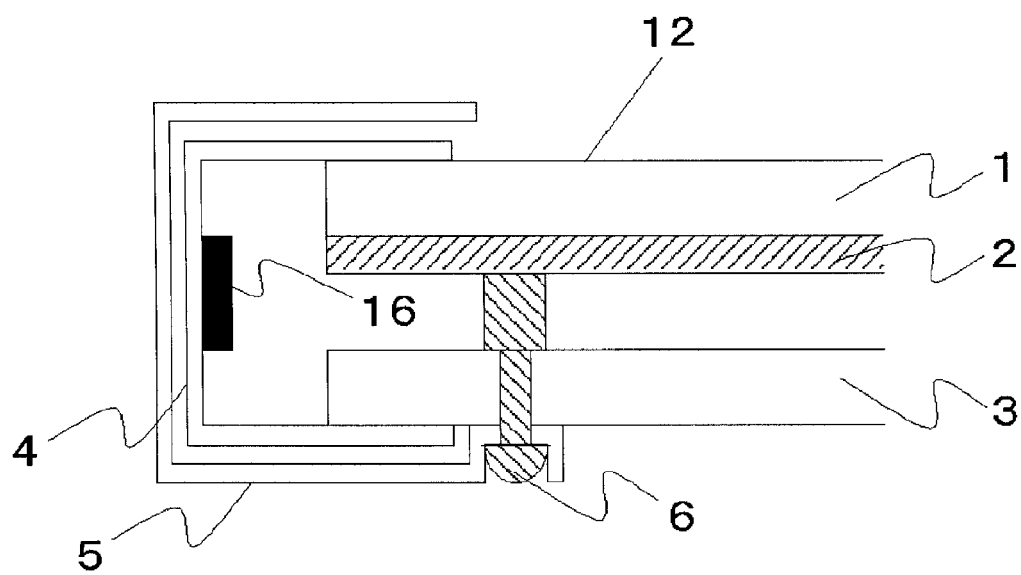
FIG. 2 is a cross-sectional view taken along line A-A' in FIG. 1A.

A constitution of the image display apparatus according to the embodiment is described with reference to FIGS. 1A, 1B and 2. FIG. 1A is a perspective view illustrating the image display apparatus according to the embodiment, and FIG. 1B is a layer structural diagram illustrating the image display apparatus according to the embodiment. FIG. 2 is a cross section (part) taken along line A-A' of FIG. 1A.

The image display apparatus according to the embodiment has a display panel 1 on a first layer viewed from a viewer, a conductive member 2 on a second layer, a control circuit substrate 3 on a third layer, a driver IC, a flexible printed circuit board 4, and a conductive cover 5. In this embodiment, the conductive member 2 and the conductive cover 5 are provided so that the electromagnetic waves leaking from the image display apparatus can be reduced. In this embodiment, the driver IC is packaged onto the flexible printed circuit board 4 (TCP or COF). The arrangement of the driver IC is not limited to this.

The display panel 1 has a plurality of wirings and a plurality of display devices 11 which are connected to the plurality of wirings. Concretely, a plurality of modulation signal wirings 12 and a plurality of scanning signal wirings 13 are formed on the display panel 1, and the plurality of display devices are wired into a simple-matrix pattern. That is to say, each display device is arranged at an intersecting point between each modulation signal wiring 12 and each scanning signal wiring 13. Hereinafter, one terminal of the modulation signal wiring 12 and the scanning signal wiring 13 is described as an input terminal of the modulation signal wiring 12 and an input terminal of the scanning signal wiring 13, respectively. The display device include any devices, for example, electron-emitting devices such as a surface-conduction type electron-emitting device, a field emission type electron-emitting device and an MIM type electron-emitting device, a liquid crystal device, a plasma display device, an LED, or the like.

The conductive member 2 is provided on a rear surface side of the display panel 1 (surface side opposite to the surface on the viewer's side). An electric potential of the conductive member 2 is regulated to a reference potential. Concretely, the conductive member 2 is electrically connected to a reference potential electrode of the control circuit substrate 3, so that the electric potential is regulated to the reference potential. In this embodiment, the reference potential is made to be uniform by a conductive connecting member 6 provided between the conductive member 2 and the control circuit substrate 3 (see FIG. 2). The control circuit substrate 3 is fixed to the conductive member 2 (concretely, the display panel 1 and the conductive member 2) by the connecting member 6. The connecting member 6 may have any form as long as it can electrically connect the conductive member 2 and the control circuit substrate 3 and fix them. Examples of the connecting member 6 are a metal screw and a metal rivet.

The control circuit substrate 3 is a circuit substrate which outputs a control signal. Concretely, the control circuit substrate 3 is composed of a modulation driver substrate 14 and a scanning driver substrate 15. The modulation driver substrate 14 outputs a control signal and modulation data from a driving control substrate, not shown, and a driving voltage from a driving power source, not shown. The scanning driver substrate 15 outputs the control signal from the driving control substrate, not shown, and the driving voltage from the driving power source, not shown.

The flexible printed circuit board (FPC) 4 has a flexible substrate and wirings formed on the flexible substrate. A driver IC is provided onto the flexible printed circuit board 4 (that is to say, the flexible printed circuit board 4 can be called also an IC package). Concretely, the wiring on an input side and a wiring on an output side of the driver IC are formed on the flexible substrate, and one terminal of the wirings is electrically connected to an input terminal and an output terminal of the driver IC, respectively. Hereinafter, the other terminals of the wirings are described as an input terminal and an output terminal of FPC.

The conductive cover 5 is provided so as to cover the flexible printed circuit board 4 from a portion connected to the control circuit substrate 3 to a portion connected to the display panel 1. The conductive cover 5 is physically connected to the control circuit substrate. In this embodiment, as shown in FIG. 2, the conductive cover 5 is connected (fixed) by the connecting member 6. In this embodiment, the conductive cover 5 and the control circuit substrate 3 are fastened together by a conductive connecting member (fastening member: metal screw or metal rivet).

The wirings among the display panel 1, the control circuit substrate 3 and the flexible printed circuit board 4 are described below.

The modulation driver substrate 14 is connected to the input terminal of FPC between the control circuit substrate 3 and the flexible printed circuit board 4. Hereinafter, the driver IC on this FPC is described as modulation driver IC 16. As a result, a control signal or the like output from the modulation driver substrate 14 is input into the modulation driver IC 16. The modulation driver IC 16 generates a modulation signal by using the input control signal or the like.

The scanning driver substrate 15 is connected to input terminal of FPC different from the FPC connected to the modulation driver substrate. Hereinafter, driver IC on this FPC is described as scanning driver IC 17. As a result, a control signal or the like output from the scanning driver substrate 15 is input into the scanning driver IC 17. The scanning driver IC 17 generates a scanning signal by using the input control signal or the like.

The input terminal of the modulating signal wiring 12 is connected to the output terminal of FPC having the modulation driver IC 16, between the display panel 1 and the flexible printed circuit board 4. As a result, the modulation signal generated in the modulation driver IC 16 is input into the display panel 1. Concretely, the modulation signal is input into the display device 11 via the modulation signal wiring 12.

The input terminal of the scanning signal wiring 13 is connected to the output terminal of FPC having the scanning driver IC 17. As a result, the scanning signal generated in the scanning driver IC 17 is input into the display panel 1. Concretely, the scanning signal is input into the display device 11 via the scanning signal wiring 13.

An effect of the present invention is described below with reference to FIGS. 3 to 6.

Figure 3:
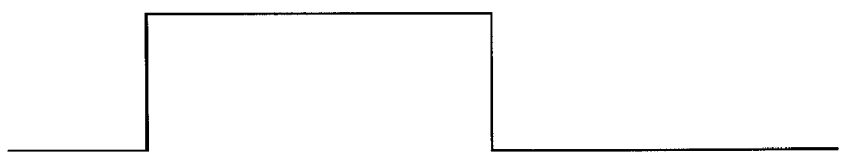
FIG. 3 is a diagram illustrating one example of a modulation signal and a scanning signal of the image display apparatus according to the embodiment.
Figure 3:
Figure 4:
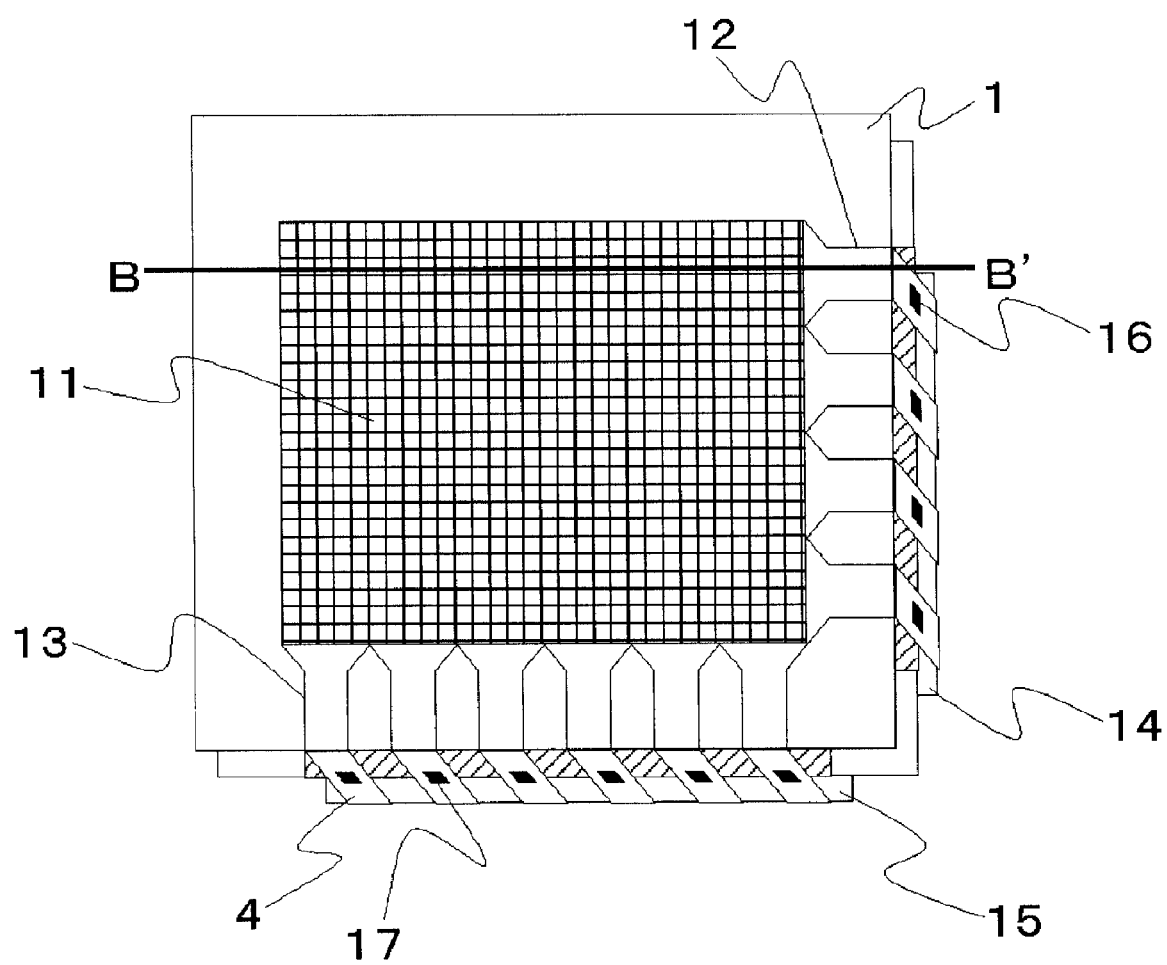
FIG. 4 is a perspective view illustrating the image display apparatus without a conductive cover.
Figure 5:
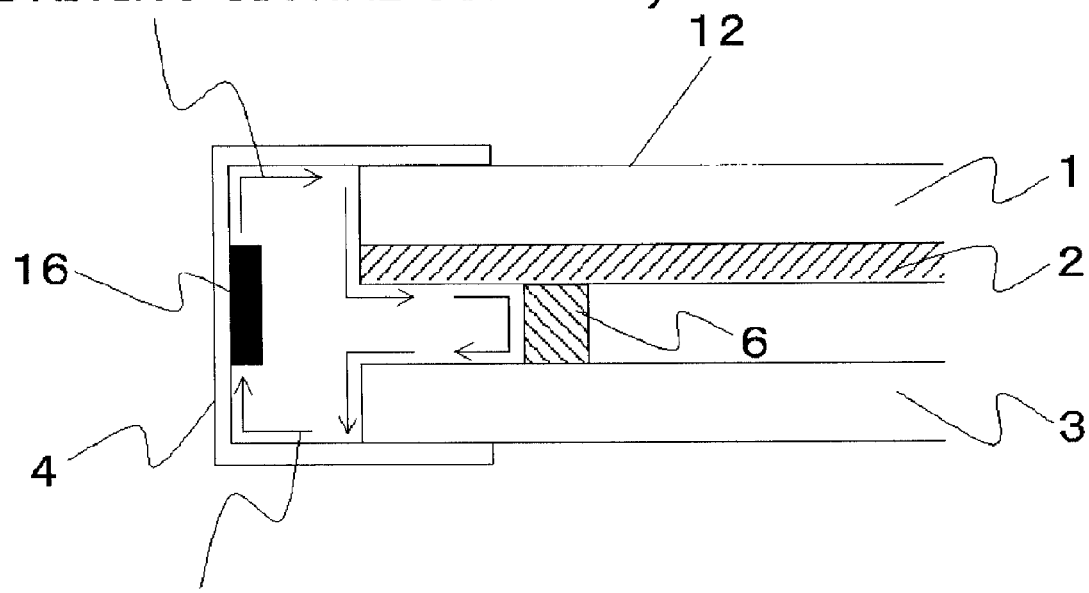
FIG. 5 is a cross-sectional view taken along line B-B' in FIG. 4.
Figure 6:
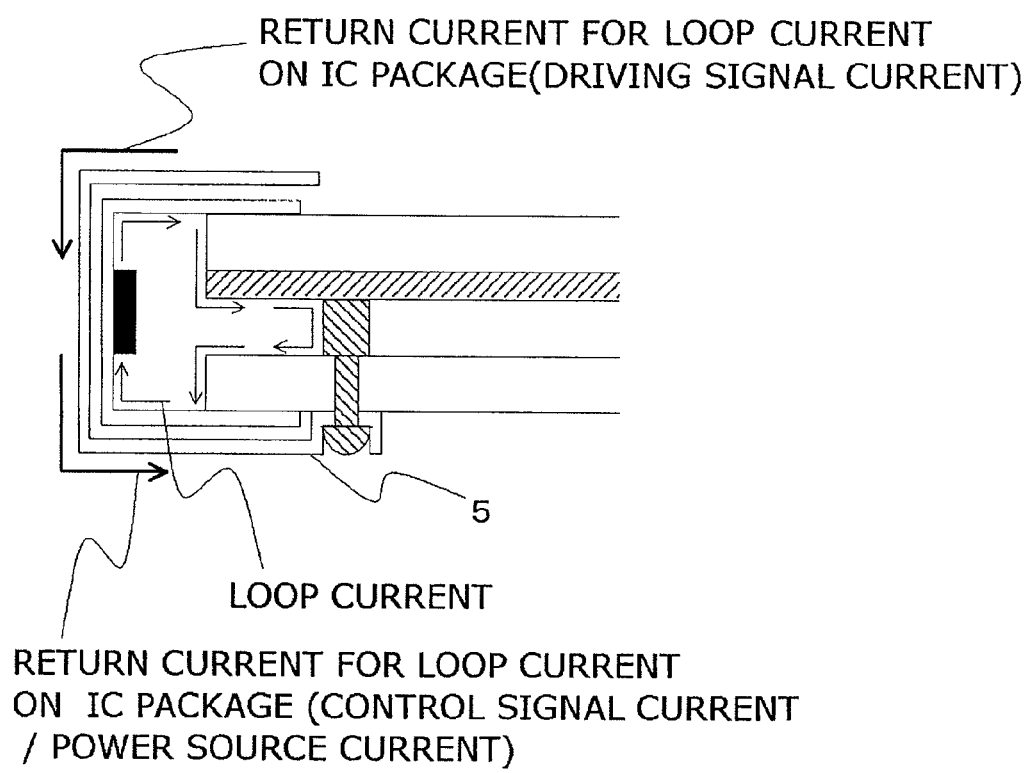
FIG. 6 is a diagram illustrating a cross section of the image display apparatus according to the embodiment.

FIG. 3 is a diagram illustrating one example of the modulation signal and the scanning signal of the image display apparatus according to the embodiment. FIG. 4 is a perspective view illustrating the image display apparatus without the conductive cover 5. FIG. 5 is a cross-sectional view (part) taken along line B-B' of FIG. 4. FIG. 6 is a diagram illustrating a cross section (part) of the image display apparatus according to the embodiment.

The modulation signal in FIG. 3 is one example of a driving signal to be input from the modulation driver IC 16 into the display device 11 via the modulation signal wiring 12. The scanning signal in FIG. 3 is one example of a driving signal to be input from the scanning driver IC 17 into the display device 11 via the scanning signal wiring 13.

In the example of FIG. 3, a square wave is used as the modulation signal and the scanning signal. The square wave has a plurality of high-frequency components. For this reason, in the image display apparatus without the conductive cover 5 shown in FIG. 4, a loop current is generated as shown in FIG. 5. Concretely, the loop current is generated on route of the modulation (or scanning) driver substrate, the modulation (or scanning) driver IC, the display panel, the conductive member, the connecting member and the modulation (or scanning) driver substrate, so that electromagnetic waves are radiated.

This embodiment describes the case where the modulation signal and the scanning signal are the square waves, but since a trapezoidal wave or a staircase wave has a plurality of high-frequency components, they can be used similarly.

On the contrary, when the conductive cover 5 is provided to the image display apparatus as shown in FIG. 6 and an electric current flows on the flexible printed circuit board 4, a return current which directs oppositely to the electric current is induced on the conductive cover 5. Concretely, return current of a control signal current flowing on the flexible printed circuit board and return current of an electric current induced by electric power supply are induced on the conductive cover. For this reason, the return currents generate magnetic fields opposite to magnetic fields generated by the electric currents (the control signal current or the electric currents induced by the power source supply) flowing on the flexible printed circuit board 4. As a result, the magnetic fields induced by the electric currents can be cancelled, and the leakage of the electromagnetic waves to the outside can be reduced.

In this embodiment, since the driver IC is provided onto the flexible printed circuit board, it can be arranged near the conductive cover. As a result, electromagnetic waves which leak into the outside can be reduced.

In this embodiment, the conductive member 2 is provided so that the leakage of electromagnetic waves to the outside can be further reduced. This is described in detail below.

Figure 7:
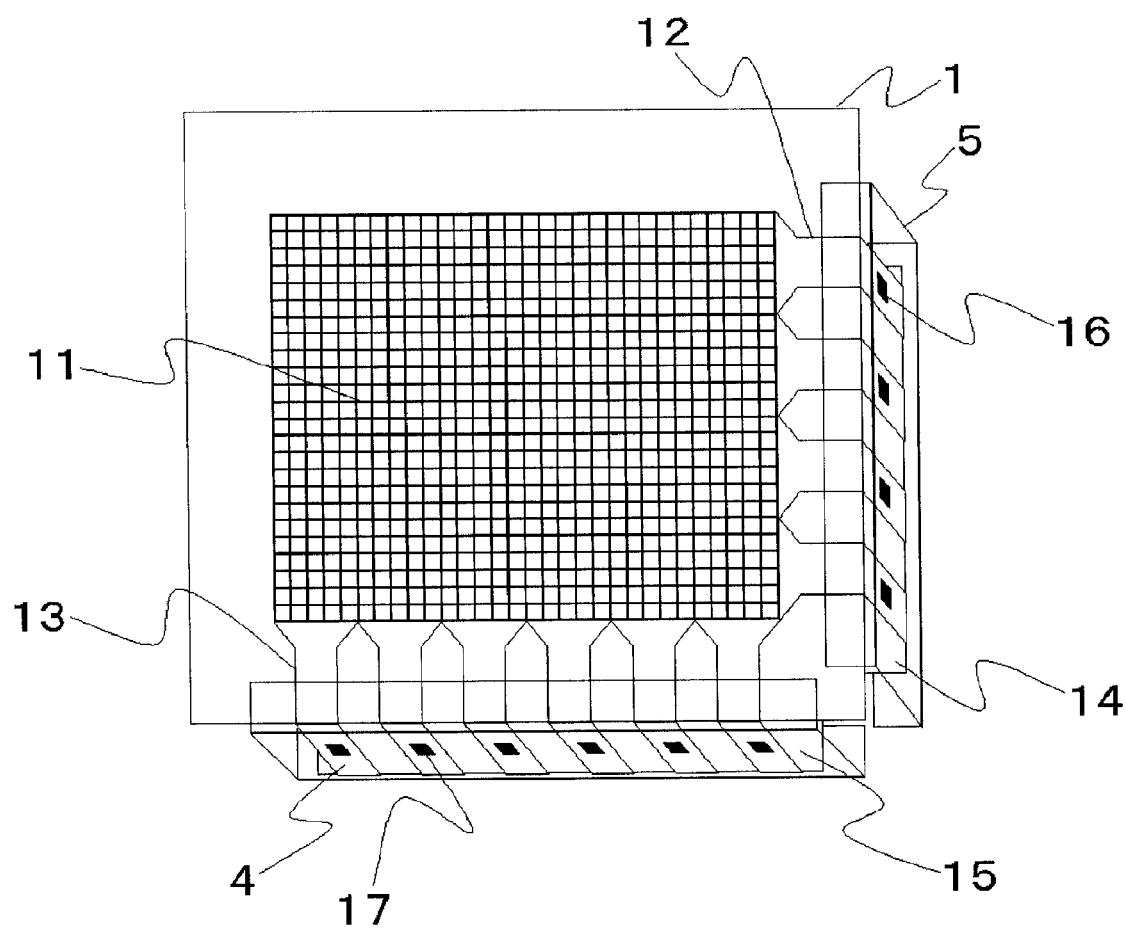
FIG. 7 is a perspective view illustrating the image display apparatus without a conductive member.
Figure 8:
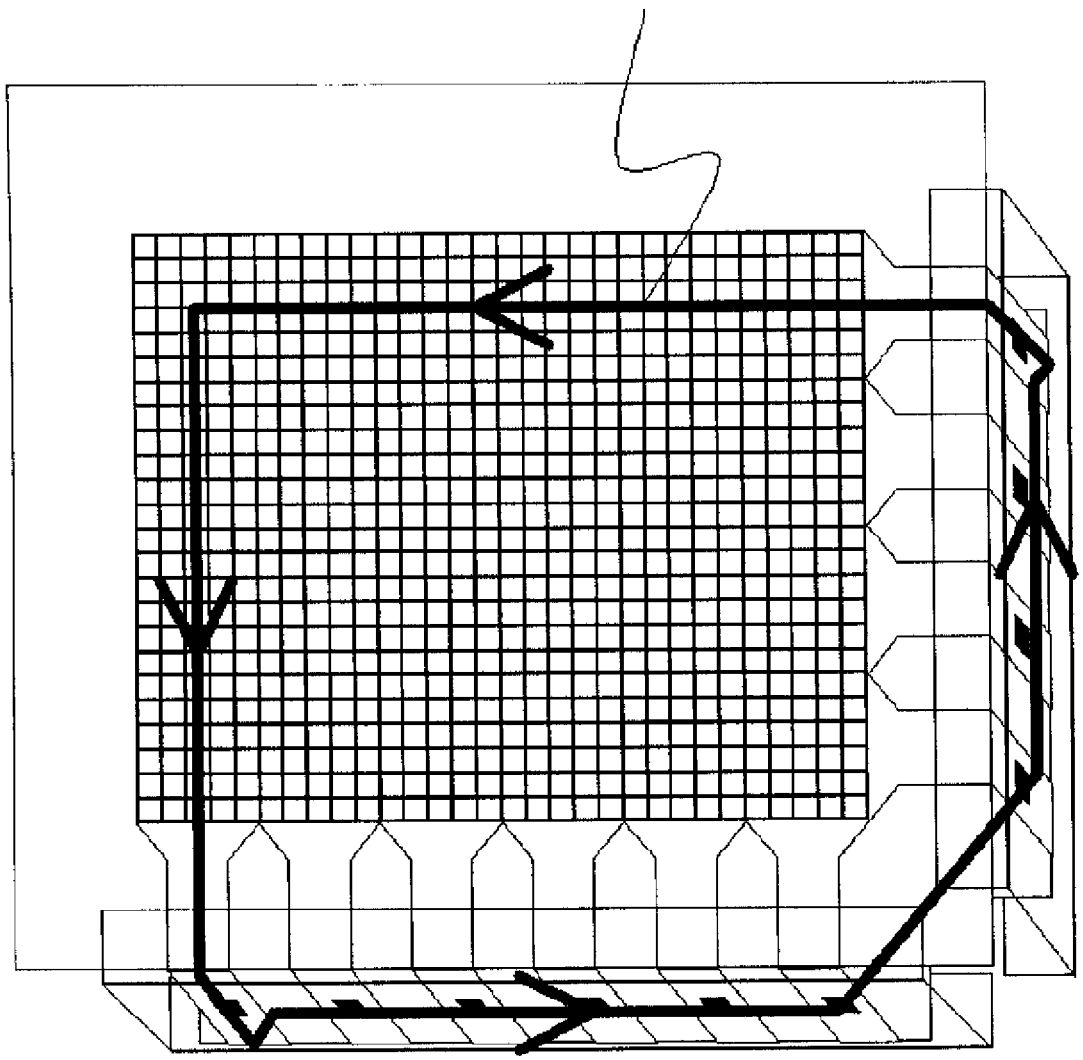
FIG. 8 is a diagram illustrating a loop current in the image display apparatus without a conductive member.

FIGS. 7 and 8 are perspective views illustrating the image display apparatus without the conductive member 2.

In such an image display apparatus (FIG. 7), when the signals shown in FIG. 3 are applied to the circuit, a loop current shown in FIG. 8 is generated. Concretely, the loop current is generated on route of the modulation driver substrate, the modulation driver IC, the modulation signal wiring, the scanning signal wiring, the scanning driver IC, the scanning driver substrate and the modulation driver substrate, so that the electromagnetic waves are radiated.

Figure 9:
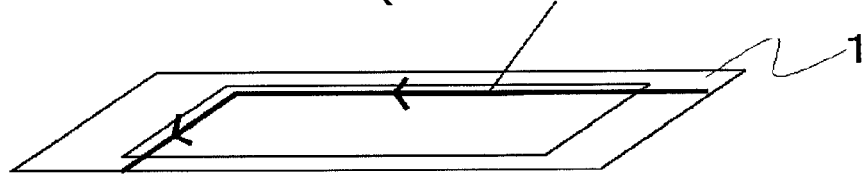
FIG. 9 is a diagram illustrating the loop current in the image display apparatus and a return current flowing in a conductive member according to the embodiment.

On the contrary, when the conductive member 2 is provided to the image display apparatus as shown in FIG. 9 and the electric current flows on the display panel 1, a return current opposite to the electric current is induced on the conductive member 2. For this reason, the return current generates a magnetic field opposite to the magnetic field generated by the electric current flowing on the display panel 1. As a result, the magnetic field induced by the electric current flowing on the display panel 1 can be cancelled, and the leakage of electromagnetic waves to the outside can be further reduced.

The conductive member 2 may be provided so as to cover at least an area where the modulation signal wirings 12 and the scanning signal wirings 13 are formed on the rear side of the display panel 1. The conductive member is provided to such an area, so that the loop current can be generated. For this reason, this image display apparatus can be constituted by fewer materials in comparison with a case where the conductive member 2 is provided so as to cover the entire rear face of the display panel 1.

In this embodiment, materials of the conductive member 2 and the conductive cover 5 are not clarified, but the conductive cover 5 may be made of any material as long as it can generate the return current. For example, the conductive cover 5 may be an aluminum plate or an iron plate. The conductive member 2 may be aluminum foil, or an ITO film. The aluminum foil may be pasted to the rear face of the display panel 1, and the ITO film may be vacuum-evaporated on the rear face. The aluminum plate or the like is provided onto the rear face of the display panel 1, so that the display panel 1 can be reinforced.

Figure 10:
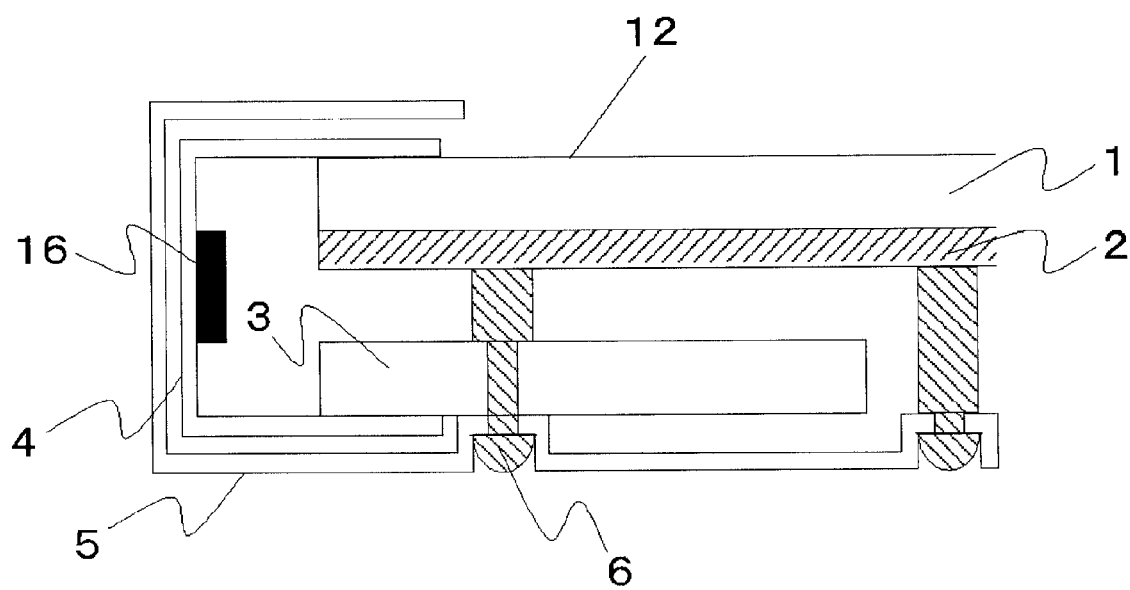
FIG. 10 is a diagram illustrating a modified example of a conductive cover in the image display apparatus according to the embodiment.

In this embodiment, the conductive cover is provided so as to cover the flexible printed circuit board from a portion connected to the control circuit substrate to a portion connected to the display panel. However, the arrangement form is not limited to this. The conductive cover may cover the flexible printed circuit board from the portion connected to the control circuit substrate to the portion connected to the display panel. For example, as shown in FIG. 10, the conductive cover has only to be provided so as to cover the entire modulation driver substrate (or scanning driver substrate). In the example of FIG. 10, the two connecting members 6 are used, but any number of connecting numbers may be used.

In this embodiment, the conductive cover, the conductive member and the control circuit substrate are fastened together by a conductive fastening member (metal screw or metal rivet). As a result, the conductive cover can be connected to a reference potential electrode of the control circuit substrate with a simple structure. When the conductive cover is electrically connected to the reference potential electrode of the control circuit substrate, a return path (current path) can be securely maintained. The same holds for the conductive member.

Figure 11:
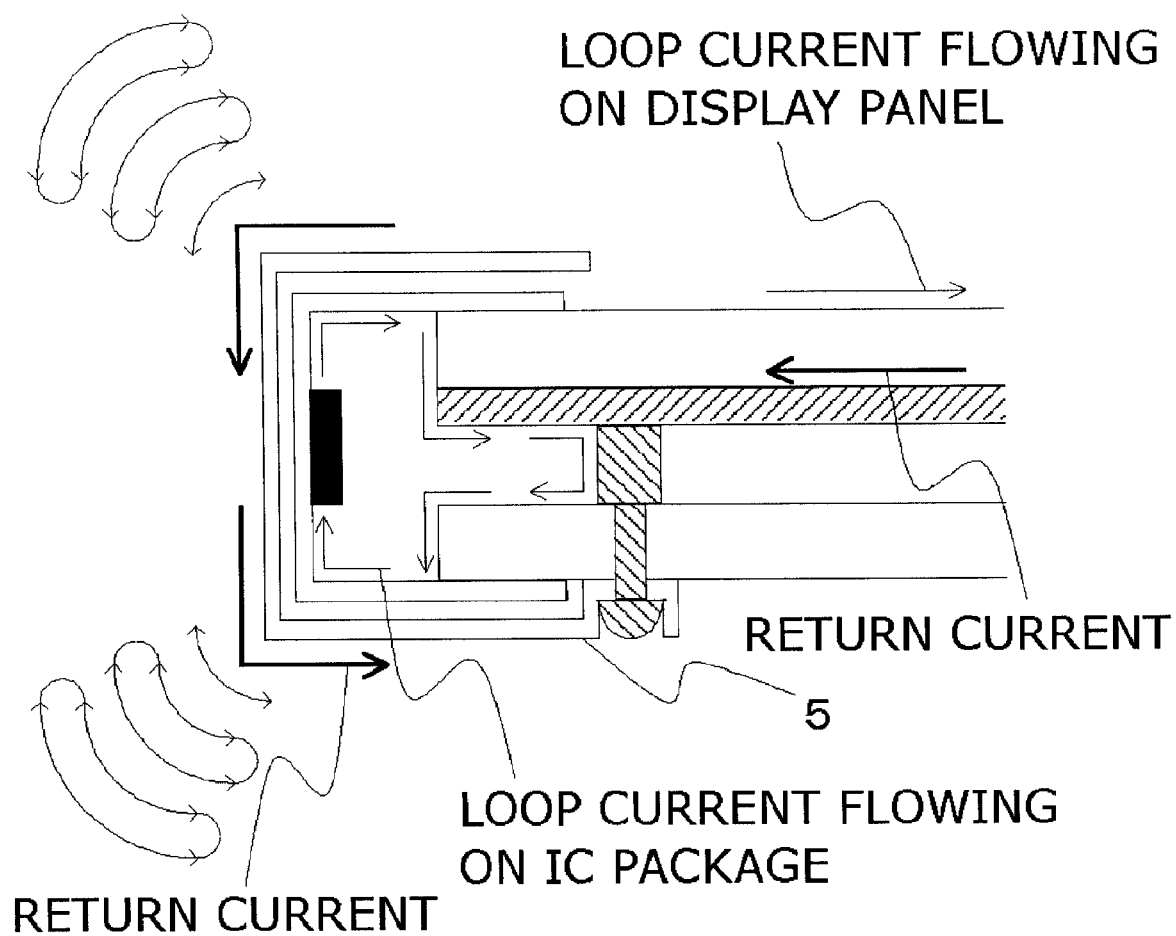
FIG. 11 is a diagram illustrating one example of the loop current flowing in the image display apparatus according to the embodiment.
Figure 12:
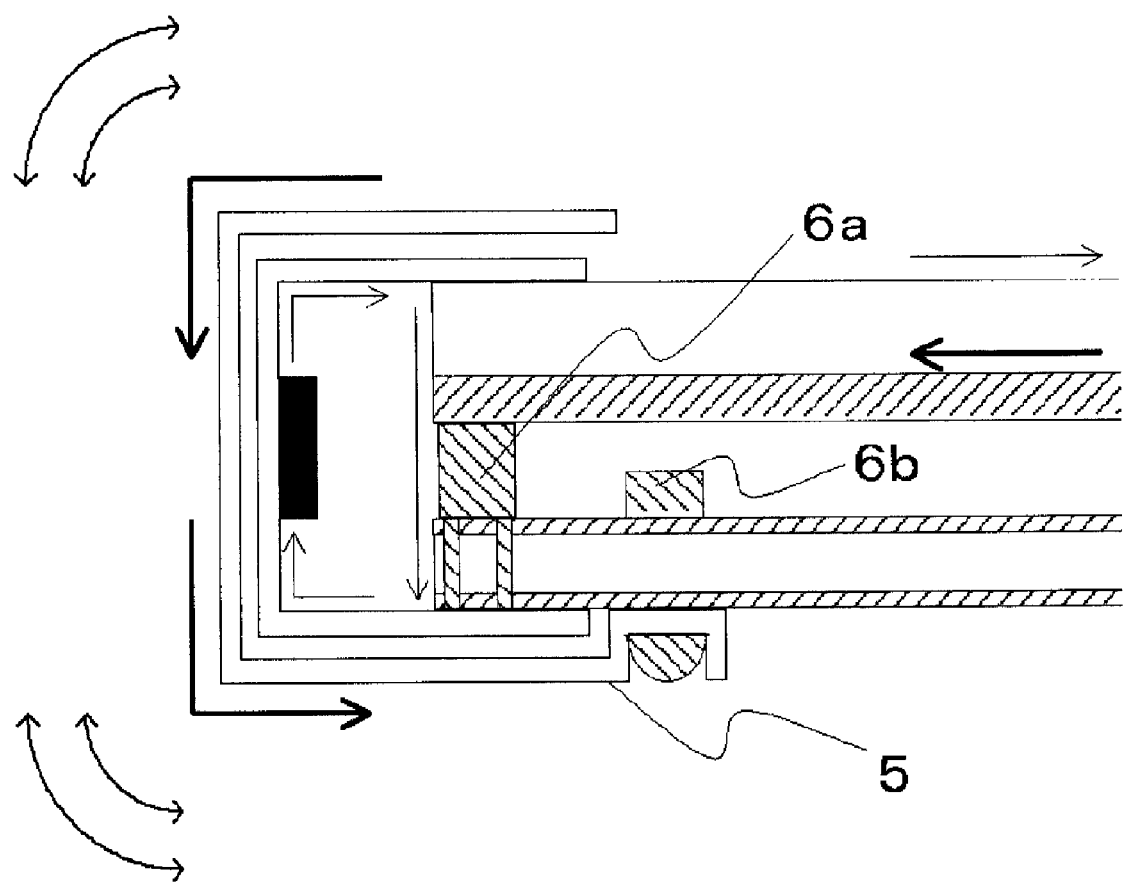
FIG. 12 is a diagram illustrating one example of the loop current flowing in the image display apparatus according to the embodiment.

It is more preferable that the connecting member 6 is arranged near the driver IC as shown in FIG. 12 than at a position far from the driver IC as shown in FIG. 11. In the example of FIG. 12, the image display apparatus has a connecting member 6a which fixes the conductive member 2 and the control circuit substrate 3, and a connecting member 6b which connects the conductive cover 5 to the control circuit substrate 3. The connecting member 6a is positioned near the driver IC. As a result, the route of the loop current including the modulation (or scanning) driver substrate, the modulation (or scanning) driver IC, the display panel, the rear face of the display panel, the connecting member and the modulation (or scanning) driver substrate can be shortened. For this reason, electromagnetic waves generated by the loop current can be further reduced.

The conductive member 2 does not have to be provided. When the conductive cover 5 is provided, electromagnetic waves which leak to the outside can be reduced. When the conductive member 2 is not provided, the connecting member 6 is provided so as to fix the control circuit substrate 3 to the display panel 1.

In the image display apparatus according to this embodiment, the conductive cover is provided so as to cover the flexible printed circuit board from the portion connected to the control circuit substrate to the portion connected to the display panel and be physically connected to the control circuit substrate. As a result, the return path for a high-frequency component of the driving waveform can be secured, and the leakage of electromagnetic waves from the signal wirings of the display panel to the outside can be reduced. Further, since the image display apparatus has the simple constitution such that the conductive cover is provided, the apparatus can be realized at a low cost.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-026341, filed on Feb. 6, 2008, which is hereby incorporated by reference herein in its entirety.

What is claimed is:

1. An image display apparatus comprising:
    a display panel having a plurality of wirings and a plurality of display devices connected to the plurality of wirings;
    a control circuit substrate which outputs a control signal and is arranged on a backside of the display panel;
    a flexible printed circuit board which has a flexible substrate and wirings formed on the flexible substrate, and electrically connects the display panel and the control circuit substrate, with the flexible printed circuit board having an angular shape; and
    a conductive cover which covers the flexible printed circuit board from a portion connected to the control circuit substrate to a portion connected to the display panel, the conductive cover having an angular shape according to the shape of the flexible printed circuit board and being electrically connected to a reference potential electrode of the control circuit substrate.

2. An image display apparatus according to claim 1, wherein the cover and the control circuit substrate are fastened together by a conductive fastening member.

3. An image display apparatus according to claim 1, wherein
    the flexible printed circuit board has a driver IC which drives the display device, and the wirings formed on the flexible substrate include a wiring for supplying the control signal to the driver IC and a wiring for supplying a signal from the driver IC to the wiring of the display panel.

4. An image display apparatus according to claim 1, wherein a rear face of the display panel has a conductive member whose potential is regulated to a reference potential.

5. An image display apparatus according to claim 4, wherein the conductive member is electrically connected to a reference potential electrode of the control circuit substrate.

6. An image display apparatus according to claim 1, wherein the flexible printed circuit board has a first portion connecting to a frontside of the display panel and a second portion connecting to a rearside of the control circuit substrate.

7. An image display apparatus comprising:
   a display panel having a plurality of wirings and a plurality of display devices connected to the plurality of wirings;
   a control circuit substrate which outputs a control signal and is arranged on a backside of the display panel;
   a flexible printed circuit board which has a flexible substrate and wirings formed on the flexible substrate, and electrically connects the display panel and the control circuit substrate; and
   a conductive cover which covers the flexible printed circuit board connected at a first portion to a topside of the display panel and at a second portion connected to a rearside of the control circuit substrate, and the cover is electrically connected to a reference potential electrode of the control circuit substrate.

8. An image display apparatus according to claim 7, wherein the cover and the control circuit substrate are fastened together by a conductive fastening member.

9. An image display apparatus according to claim 7, wherein
   the flexible printed circuit board has a driver IC which drives the display device, and
   the wirings formed on the flexible substrate include a wiring for supplying the control signal to the driver IC and a wiring for supplying a signal from the driver IC to the wiring of the display panel.

10. An image display apparatus according to claim 7, wherein the backside of the display panel has a conductive member whose potential is regulated to a reference potential.

11. An image display apparatus according to claim 10, wherein the conductive member is electrically connected to a reference potential electrode of the control circuit substrate.

12. An image display apparatus according to claim 7, wherein the conductive cover has substantially the same shape as the flexible printed circuit board.

* * * * *